United States Patent
Wehlus

(10) Patent No.: US 9,627,643 B2
(45) Date of Patent: Apr. 18, 2017

(54) OPTOELECTRONIC COMPONENT

(71) Applicant: OSRAM OLED GmbH, Regensburg (DE)

(72) Inventor: Thomas Wehlus, Lappersdorf (DE)

(73) Assignee: OSRAM OLED GMBH, Regensburg (DE)

( * ) Notice: Subject to any disclaimer, the term of this patent is extended or adjusted under 35 U.S.C. 154(b) by 3 days.

(21) Appl. No.: 14/443,401

(22) PCT Filed: Nov. 6, 2013

(86) PCT No.: PCT/EP2013/073199
§ 371 (c)(1),
(2) Date: May 18, 2015

(87) PCT Pub. No.: WO2014/075977
PCT Pub. Date: May 22, 2014

(65) Prior Publication Data
US 2015/0295201 A1    Oct. 15, 2015

(30) Foreign Application Priority Data

Nov. 19, 2012  (DE) .................. 10 2012 221 095

(51) Int. Cl.
*H01L 51/52* (2006.01)
(52) U.S. Cl.
CPC ...... *H01L 51/5209* (2013.01); *H01L 51/5212* (2013.01); *H01L 51/5215* (2013.01);
(Continued)

(58) Field of Classification Search
CPC ............. H01L 51/5209; H01L 51/5225; H01L 51/5234; H01L 51/5215; H01L 51/5212; H01L 2251/5323; H01L 33/38
See application file for complete search history.

(56) References Cited

U.S. PATENT DOCUMENTS

2009/0250712 A1* 10/2009 Xuan .................. H01L 33/0004
257/94
2009/0256470 A1   10/2009 Naono
(Continued)

FOREIGN PATENT DOCUMENTS

CN       201859896 U     6/2011
DE    102006016373 A1   10/2007
(Continued)

OTHER PUBLICATIONS

International Search Report based on Application No. PCT/EP2013/073199 (2 Pages and 2 pages of English translation) dated Apr. 4, 2014 (Reference Purpose Only).
(Continued)

*Primary Examiner* — Michael Jung
*Assistant Examiner* — Mikka Liu
(74) *Attorney, Agent, or Firm* — Viering, Jentschura & Partner mbB

(57) ABSTRACT

Various embodiments may relate to an optoelectronic component, including a substrate, a first electrically conductive electrode layer, a second electrically conductive electrode layer, an organic layer structure, and a conductor track layer. The first electrically conductive electrode layer, the second electrically conductive electrode layer and the conductor track layer are formed in each case from an optically transparent material.

9 Claims, 1 Drawing Sheet

(52) U.S. Cl.
CPC ...... *H01L 51/5225* (2013.01); *H01L 51/5228* (2013.01); *H01L 51/5234* (2013.01); *H01L 2251/301* (2013.01); *H01L 2251/5323* (2013.01); *H01L 2251/5361* (2013.01)

(56) References Cited

U.S. PATENT DOCUMENTS

2009/0261371 A1\*  10/2009  Schindler ............ H01L 51/5203
                                                            257/98
2010/0156276 A1    6/2010  Frank et al.
2012/0261711 A1\*  10/2012  Brown .................... H01L 33/62
                                                            257/99

FOREIGN PATENT DOCUMENTS

| DE | 102010042132 A1 | 4/2012 |
| JP | 2005158483 A | 6/2005 |
| JP | 2012138311 A | 7/2012 |
| JP | 2012227459 A | 11/2012 |
| WO | 2012045857 A1 | 4/2012 |

OTHER PUBLICATIONS

Korean Office Action based on Application No. 10-2015-7016000 (4 Pages and 4 Pages of English translation) dated Apr. 21, 2016 (Reference Purpose Only).

\* cited by examiner

OPTOELECTRONIC COMPONENT

RELATED APPLICATIONS

The present application is a national stage entry according to 35 U.S.C. §371 of PCT application No.: PCT/EP2013/073199 filed on Nov. 6, 2013, which claims priority from German application No.: 10 2012 221 095.4 filed on Nov. 19, 2012, and is incorporated herein by reference in its entirety.

TECHNICAL FIELD

Various embodiments relate to an optoelectronic component.

BACKGROUND

An optoelectronic component may have a plurality of organic layer structures arranged between two electrode layers, one of which usually is embodied in an optically transparent fashion. During the production of optoelectronic components, organic layers are successively applied to an electrically conductive electrode layer arranged on a substrate, followed by a further electrically conductive electrode layer. Two different classes of materials are generally used for the production of optoelectronic components: polymeric substances and so-called small-molecule materials, which have no orientation property and therefore form amorphous layers. Organic molecules generally have a wide emission spectrum. As a result, all color components of light are present in the spectrum. This enables a natural illumination of objects. The emissions of an optoelectronic component, in particular of an OLED, can be coordinated with practically any color, including white, with any possible color temperature. Most white OLEDs consist of a red, a green and a blue emission layer, which together generate high-quality white light.

One technical challenge for large-area optoelectronic components is the restricted conductivity of the electrode layer material, in particular of the electrode layer embodied as an anode, which leads to a significant voltage drop in the electrode layer and a decrease in the local operating voltage of the active layers. As a result, the radiation intensity of the optoelectronic assembly decreases from the edges toward the midpoint. In order to reduce the reduction of the radiation intensity, a conductor track structure, also called busbar, composed of metal is applied to the electrode layer embodied as an anode. The luminance distribution of the organic light emitting unit can be made uniform as a result. The luminance distribution achievable here is insufficient for some specific applications, however.

SUMMARY

Various embodiments provide an optoelectronic component by which the luminance distribution can be improved further.

In various embodiments, an optoelectronic component may include: a substrate, a first electrically conductive electrode layer, a second electrically conductive electrode layer, at least one organic layer structure, and a conductor track structure, wherein the first conductive electrode layer, the second conductive electrode layer and the conductor track structure are formed in each case from an optically transparent material.

In various embodiments, the term "transparent material" may be understood to mean that a material is transmissive to light (for example at least in a partial range of the wavelength range of 380 nm to 780 nm), wherein light coupled into a structure (for example a material), is also coupled out from the structure (for example material), substantially without scattering or light conversion.

The optoelectronic component includes a first electrically conductive electrode layer embodied as an anode and a second electrically conductive electrode layer embodied as a cathode, wherein the organic layer structure and the conductor track structure can be arranged between these two electrode layers. The first electrically conductive electrode layer embodied as an anode and the second electrically conductive electrode layer embodied as a cathode are formed from an optically transparent material. Furthermore, the conductor track structure is also formed from an optically transparent material, as a result of which a reduction of the effective area of the optoelectronic component can be prevented and the distribution of the luminance over the area of the optoelectronic component can thereby be made more uniform to a further extent. By way of example, if the first electrically conductive electrode layer embodied as an anode and the second electrically conductive electrode layer embodied as a cathode have a sheet resistance of 5 $\Omega$, a uniformity or a contrast of 73% can be achieved with a conductor track structure formed from an optically transparent material, wherein the luminance is for example approximately 2848 nits at the edge of the optoelectronic component and approximately 1643 nits in the center of the optoelectronic component.

The first electrically conductive electrode layer and the second electrically conductive electrode layer may be formed from the same optically transparent material, as a result of which the homogeneity of the optoelectronic component, for example with regard to its emission properties, can be improved. The optoelectronic component can be formed from indium tin oxide (ITO) for example, but other materials can also be used.

The optoelectronic component of the conductor track structure may contain silver. The conductivity of the conductor track structure may be improved by the silver, as a result of which the luminance distribution over the area of the optoelectronic component and hence the uniformity may also be improved further. The silver used can be embodied for example as ductile silver, which is distinguished by being readily deformable, or as a magnesium-silver alloy (MgAg alloy).

The conductor track structure may be formed from a first conductor track layer and a second conductor track layer, wherein the first conductor track layer may be arranged at the first electrically conductive electrode layer and the second conductor track layer may be arranged at the second electrically conductive electrode layer. The conductor track structure is therefore embodied in two conductor track layers which are arranged in a manner separated from one another and which are spatially separated from one another by the organic layer structure arranged between the two electrode layers and are electrically connected to one another by said organic layer structure. Accordingly, the conductor track structure is formed at the electrode layer embodied as an anode and also at the electrode layer embodied as a cathode, as a result of which the homogeneity of the luminance distribution can be improved further.

In this case, the first conductor track layer and the second conductor track layer may be formed in such a way that the conductor track structure forms a closed area. This means that, in a plan view of the conductor track structure, the latter extends over the entire area of the optoelectronic component, for example without a region formed in a manner free of conductor track structure. This is achieved by virtue of the fact that at the regions, no first conductor track layer is formed in the case of the electrode layer embodied as an anode, the second conductor track layer is formed at the electrode layer embodied as a cathode. An overlap of the first conductor track layer and the second conductor track layer may be optional, for example not provided. The fact that the two conductor track layers supplement one another to form a closed area can prevent the transparency from varying over the area of the optoelectronic component.

In order to form a closed area, the first conductor track layer and the second conductor track layer may be formed in each case from a multiplicity of areas arranged parallel to one another, for example wedge-shaped areas. The wedge-shaped areas are formed for example in a triangular fashion, with a constant thickness. The wedge-shaped areas of the first conductor track layer which are arranged at the electrode layer embodied as an anode extend along the regions in which the wedge-shaped areas of the second conductor track layer which are arranged at the electrode layer embodied as a cathode are precisely free of second conductor track layer, such that both at the electrode layer embodied as an anode and at the electrode layer embodied as a cathode the conductor track structure forms a type of serrated pattern, for example, wherein the serrated pattern of the first conductor track layer at the electrode layer embodied as an anode can engage as it were with an accurate fit in the serrated pattern of the second conductor track layer at the electrode layer embodied as a cathode, such that regions at which no conductor track structure is provided can be reduced.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

The following detailed description refers to the accompanying drawings, which form part of this description and show for illustrative purposes specific embodiments in which the invention can be implemented. In this regard, direction terminology such as, for instance, "at the top", "at the bottom", "at the front", "at the back", "above", "below", "alongside", etc. is used with respect to the orientation of the figures described. Since component parts of embodiments can be positioned in a number of different orientations, the direction terminology serves for illustrative purposes and is not restrictive in any way whatsoever. It goes without saying that other embodiments can be used and structural or logical modifications can be made, without departing from the scope of protection of the present invention. It goes without saying that the features of the various embodiments described herein can be combined with one another, unless specifically indicated otherwise. The following detailed description should therefore not be interpreted in a restrictive sense, and the scope of protection of the present invention is defined by the appended claims.

In the context of this description, the terms "connected" and "arranged" are used to describe both a direct and an indirect connection, and a direct or indirect arrangement. In the figures, identical or similar elements are provided with identical reference signs, insofar as this is expedient.

In various embodiments, an optoelectronic component can be embodied as an organic light emitting diode (OLED), as an organic photodiode (OPD), as an organic solar cell (OSC) or as an organic transistor, for example as an organic thin film transistor (OTFT). In various embodiments, the optoelectronic component can be part of an integrated circuit. Furthermore, a plurality of optoelectronic components can be provided, for example in a manner accommodated in a common housing.

Figure 1:
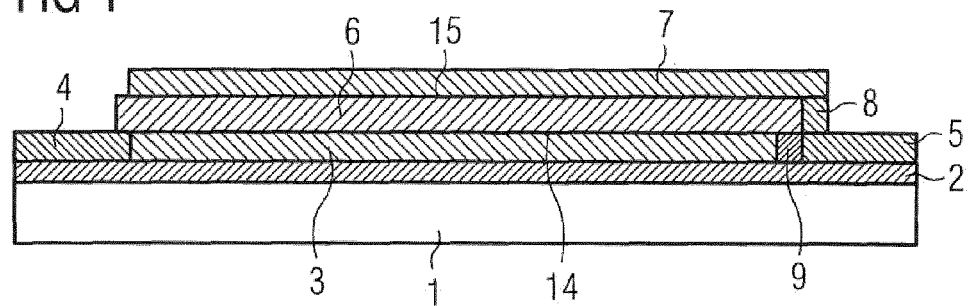
FIG. 1 shows a schematic sectional illustration of an optoelectronic component.

FIG. 1 shows an optoelectronic component in a section view, such that the layer construction of the optoelectronic component is schematically illustrated.

The optoelectronic component includes a substrate 1. The substrate 1 may serve for example as a carrier element for electronic elements or layers, for example optoelectronic elements in the form of an electrode layer. By way of example, the substrate 1 may include or be formed from glass, quartz, and/or a semiconductor material or any other suitable material. Furthermore, the substrate 1 may include or be formed from a plastic film or a laminate including one or including a plurality of plastic films. The plastic may include or be formed from one or a plurality of polyolefins (for example high or low density polyethylene (PE) or polypropylene (PP)). Furthermore, the plastic may include or be formed from polyvinyl chloride (PVC), polystyrene (PS), polyester and/or polycarbonate (PC), polyethylene terephthalate (PET), polyethersulfone (PES) and/or polyethylene naphthalate (PEN). Furthermore, the substrate 1 may include or be formed from a metal film, for example an aluminum film, a high-grade steel film, a copper film or a combination or a layer stack thereon. The substrate 1 may include one or a plurality of the materials mentioned above. The substrate 1 can be embodied as translucent, for example transparent, partly translucent, for example partially transparent, or else opaque.

A layer 2 composed of indium tin oxide and a first electrically conductive electrode layer 3 can be applied on the substrate 1. The first electrode layer 3 can be embodied as an anode, that is to say as a hole-injecting material. The first electrically conductive electrode layer 3 embodied as an anode is formed of an optically transparent material, for example a transparent conductive oxide (TCO), or a layer stack of a plurality of layers. Transparent conductive oxides are transparent conductive materials, for example metal oxides, such as, for example, zinc oxide, tin oxide, cadmium oxide, titanium oxide, indium oxide, or indium tin oxide (ITO). Alongside binary metal-oxygen compounds, such as, for example, ZnO, $SnO_2$, or $In_2O_3$, ternary metal-oxygen compounds, such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, the TCOs do not necessarily correspond to a stoichiometric composition and can furthermore be p-doped or n-doped.

In various embodiments, the first electrode layer 3 can be formed by a layer stack of a combination of a layer of a metal on a layer of a TCO, or vice versa. One example is a silver layer applied on an indium tin oxide layer (ITO) (Ag on ITO). In various embodiments, the first electrode layer 3 may include a metal (for example Ag, Pt, Au, Mg) or a metal alloy of the materials described (for example an AgMg alloy). In various embodiments, the first electrode layer 3 may include AlZnO or similar materials.

For the case where the optoelectronic component is designed as a bottom emitter, the first electrode layer 3 can have for example a layer thickness of less than or equal to approximately 25 nm, for example a layer thickness of less than or equal to approximately 20 nm, for example a layer thickness of less than or equal to approximately 18 nm. Furthermore, the first electrode layer 3 can have for example a layer thickness of greater than or equal to approximately 10 nm, for example a layer thickness of greater than or equal to approximately 15 nm. In various embodiments, the first electrode layer 3 can have a layer thickness in a range of approximately 10 nm to approximately 25 nm, for example a layer thickness in a range of approximately 10 nm to approximately 18 nm, for example a layer thickness in a range of approximately 15 nm to approximately 18 nm.

For the case where the optoelectronic component is designed as a top emitter, the first electrode layer 3 can have for example a layer thickness of greater than or equal to approximately 40 nm, for example a layer thickness of greater than or equal to approximately 50 nm.

The first electrode layer 3 can have a first electrical terminal, to which a first electrical potential (provided by an energy source (not illustrated) (for example a current source or a voltage source) can be applied. Alternatively, the first electrical potential can be applied to the substrate 1 and then be fed indirectly to the first electrode layer 3 via said substrate. The first electrical potential can be for example the ground potential or some other predefined reference potential.

Alongside, in particular at the edge region of, the first electrically conductive electrode layer 3 embodied as an anode, a contact 4, 5 is in each case arranged therefor, said contact likewise being applied on the layer 2 formed from indium tin oxide.

An organic functional layer structure 6 is applied above the first electrically conductive electrode layer 3 embodied as an anode.

The organic functional layer structure 6 may contain one or a plurality of emitter layers, for example including fluorescent and/or phosphorescent emitters, and one or a plurality of hole-conducting layers.

Examples of emitter materials which can be used in the optoelectronic component in accordance with various embodiments for the emitter layer(s) include organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl(2-carboxypyridyl) iridium III), green phosphorescent Ir(ppy)$_3$ (tris(2-phenylpyridine)iridium III), red phosphorescent Ru (dtb-bpy)$_3$*2(PF$_6$) (tris[4,4'-di-tert-butyl-(2,2')-bipyridine]ruthenium(III) complex) and blue fluorescent DPAVBi (4,4-bis[4-(di-p-tolylamino)styryl]biphenyl), green fluorescent TTPA (9,10-bis[N,N-di(p-tolyl)amino]anthracene) and red fluorescent DCM2 (4-dicyanomethylene)-2-methyl-6-julolidyl-9-enyl-4H-pyran) as non-polymeric emitters. Such non-polymeric emitters can be deposited by thermal evaporation, for example.

Furthermore, it is possible to use polymer emitters, which can be deposited, in particular, by a wet-chemical method such as spin coating, for example.

The emitter materials can be embedded in a matrix material in a suitable manner.

It should be pointed out that other suitable emitter materials are likewise provided in other embodiments.

The emitter layer(s) can be n-doped. Metals having a low work function, for example cesium, lithium or magnesium, can be used for the n-doping. Compounds which contain said metals are likewise suitable as n-type dopant, thus for example Cs2CO3, CsF or LiF. Said dopants are introduced into a matrix material. An example of a suitable matrix material is TPBi (1,3,5-tris(1-phenyl-1H-benyimidazol-2-yl)benzene).

The emitter materials of the emitter layer(s) of the optoelectronic component may be selected for example such that the optoelectronic component emits white light. The emitter layer(s) may include a plurality of emitter materials that emit in different colors (for example blue and yellow or blue, green and red); alternatively, the emitter layer(s) may also be constructed from a plurality of partial layers, such as a blue fluorescent emitter layer or blue phosphorescent emitter layer, a green phosphorescent emitter layer and a red phosphorescent emitter layer. By mixing the different colors, the emission of light having a white color impression can result. Alternatively, provision may also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary and secondary radiation.

The one or the plurality of hole-conducting layers may be p-doped, for example with one or a plurality of dopants, such as, for example, V2O5, MoO3, WO3 or F4-TCNQ (2,3,5,6-tetrafluoro-7,7,8,8-tetracyanoquinodimethane), or a copper complex (for example copper(I) pentafluorobenzoate). In this case, the following materials can be used as part of the matrix material:

NPB (N,N'-bis(1-naphthyl)-N,N'-bis(phenyl)benzidine, β-NPB (N,N'-bis(naphthalen-2-yl)-N,N'-bis(phenyl)benzidine), TPD (N,N'-bis(3-methylphenyl)-N,N'-bis(phenyl)-benzidine), N,N'-bis(1-naphthyl)-N,N'-bis(phenyl)-2,2-dimethylbenzidine, spiro-TPD (N,N'-bis(3-methylphenyl)-N,N'-bis(phenyl)-9,9-spirobifluorene), spiro-NPB(N,N'-bis(1-naphthyl)-N,N'-bis(phenyl)-9,9-spirobifluorene), DMFL-TPD (N,N'-bis(3-methylphenyl)-N,N'-bis(phenyl)-9,9-dimethylfluorene, DMFL-NPB (N,N'-bis(1-naphthyl)-N,N'-bis(phenyl)-9,9-dimethylfluorene), DPFL-TPD (N,N'-bis(3-methylphenyl)-N,N'-bis(phenyl)-9,9-diphenylfluorene), DPFL-NPB (N,N'-bis(naphth-1-yl)-N,N'-bis(phenyl)-9,9-diphenylfluorene), Sp-TAD (2,2',7,7'-tetrakis(n,n-diphenylamino)-9,9',spirobifluorene), TAPC (di-[4-(N,N-ditolylamino)phenyl]cyclohexane), spiro-TTB (2,2',7,7'-tetra(N,N-di-tolyl)amino-spiro-bifluorene), BPAPF (9,9-bis[4-(N,N-bis-biphenyl-4-ylamino)phenyl]-9H-fluorene), spiro 2NPB (2,2',7,7'-tetrakis[N-naphthyl(phenyl)-amino]-9,9-spirobifluorene), spiro-5 (2,7-bis[N,N-bis(9,9-spirobifluoren-2-yl)-amino]-9,9-spirobifluorene), 2,2'-spiro-DBP(2,2'-bis[N,N-bis(biphenyl-4-yl)amino]-9-,9-spirobifluorene), PAPB (N,N'-bis(phenanthrene-9-yl)-N,N'-bis(phenyl)-benzidine), TNB (N,N,N',N'-tetra-naphthalen-2-yl-benzidine), spiro-BPA (2,2'-bis(N,N-di-phenyl-amino)-9,9-spirobifluorene), NPAPF (9,9-bis[4-(N,N-bis-naphthyl-amino)phenyl]-9H-fluorene), NPBAPF (9,9-bis[4-(N,N'-bis-naphth-2-yl-N, N'-bis-phenyl-amino)-phenyl]-9H-fluorene), TiOPc (titanium oxide phthalocyanine), CuPc (copper phthalocyanine), F4-TCNQ (2,3,5,6-tetrafluoro-7,7,8,8,-tetracyano quinodimethane), m-MTDATA (4,4',4''-tris(N-3-methylphenyl-N-phenyl-amino)triphenylamine), 2T-NATA (4,4',4''-tris (N-(naphthalen-2-yl)-N-phenyl-amino)triphenylamine, 1-TNATA (4,4',4''-tris(N-(1-naphthyl)-N-phenyl-amino)triphenylamine), NATA (4,4',4''-tris(N,N-diphenyl-amino)triphenylamine), PPDN (pyrazino[2,3-f][1,10]phenanthroline-2,3-dicarbonitrile), MeO-TPD (N,N,N'N'-tetrakis(4-methoxyphenyl)-benzidine), MeO-spiro-TPD (2,7-bis[N,N-bis(4-methoxy-phenyl)amino]9,9-spirobifluorene), 2,2'-MeO-spiro-TPD (2,2'-bis[N,N-bis(4-methoxyphenyl (amino]-9,9-spirobifluorene), β-NPP (N,N'-di(naphthalen-2-yl)-N,N'-diphenylbenzene-1,4-diamine), NTNPB (N,N'-diphenyl-N,N'-di-[4-(N,N-di-tolyl-amino)phenyl]-benzidine) or NPNPB (N,N'-di-phenyl-N,N'-di-[4-(N,N-di-phenyl-amino)phenyl]benzidine).

The organic functional layer structure 6 may generally include one or a plurality of functional layers. The one or the plurality of functional layers may include organic polymers, organic oligomers, organic monomers, organic small, non-polymeric molecules ("small molecules") or a combination of these materials. By way of example, the organic functional layer structure 6 may include one or a plurality of functional layers embodied as a hole transport layer, so as to enable for example in the case of an OLED an effective hole injection into an electroluminescent layer or an electroluminescent region. By way of example, tertiary amines, carbazo derivatives, conductive polyaniline or polyethylene dioxythiophene can be used as material for the hole transport layer. In various embodiments, the one or the plurality of functional layers can be embodied as an electroluminescent layer.

In various embodiments the hole transport layer can be applied, for example deposited, on or above the first electrode layer 3 and the emitter layer can be applied, for example deposited, on or above the hole transport layer.

In various embodiments, the organic functional layer structure 6 (that is to say for example the sum of the thicknesses of hole transport layer(s) and emitter layer(s)) can have a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic functional layer structure 6 can have for example a stack of a plurality of organic light emitting diodes (OLEDs) arranged directly one above another, wherein each OLED can have for example a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic functional layer structure 6 can have for example a stack of three or four OLEDs arranged directly one above another, in which case for example the organic functional layer structure 6 can have a layer thickness of a maximum of approximately 3 µm.

The optoelectronic component may optionally generally include further organic functional layers, for example arranged on or above the one or the plurality of emitter layers, which serve to further improve the functionality and thus the efficiency of the optoelectronic component.

The optoelectronic component can be embodied as a "bottom emitter" and/or "top emitter".

A second electrically conductive electrode layer 7 embodied as a cathode is applied on the organic layer structure 6, such that the organic layer structure 6 is arranged between the first electrically conductive electrode layer 3 embodied as an anode and the second electrically conductive electrode layer 7 embodied as a cathode. The second electrically conductive electrode layer 7 embodied as a cathode is likewise formed from an optically transparent material, for example likewise indium tin oxide, such that the two electrode layers 3, 7 are formed from the same material.

The second electrode layer 7 can have a second electrical terminal, to which a second electrical potential, which is different than the first electrical potential, provided by the energy source, can be applied. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 5 V to approximately 10 V.

Adjoining the organic layer structure 6, a further contact 8 is arranged therefor laterally with respect thereto, wherein said contact 8 adjoins the contact 5. Furthermore, an intermediate layer 9 is formed between the contact 5 and the first electrically conductive electrode layer 3 embodied as an anode, which intermediate layer can be embodied as insulation or a further organic layer structure.

Figure 2:
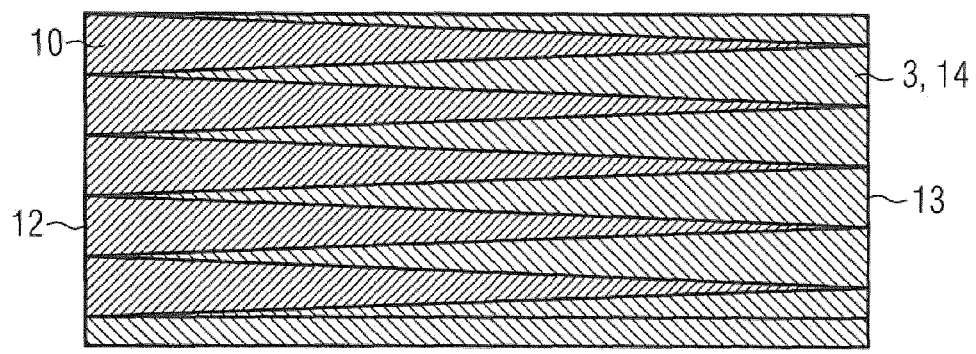
FIG. 2 shows a schematic illustration of a plan view of a first conductor track layer of a conductor track structure of the optoelectronic component, which is arranged at the first electrically conductive electrode layer embodied as an anode.
Figure 3:
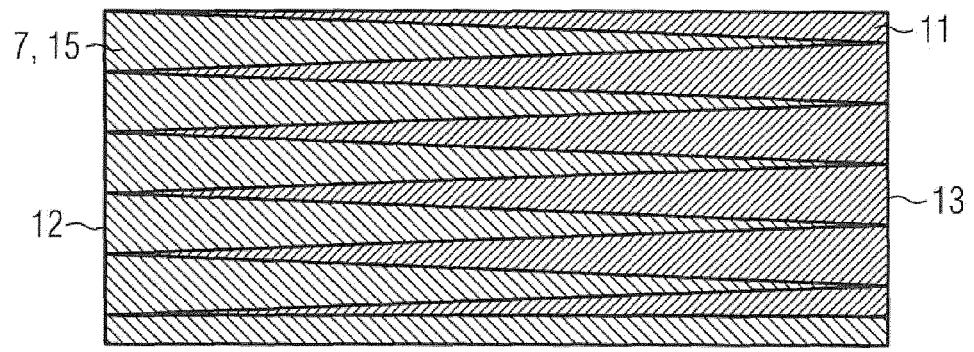
FIG. 3 shows a schematic illustration of a plan view of a second conductor track layer of a conductor track structure of the optoelectronic component, which is arranged at the second electrically conductive electrode layer embodied as a cathode.

As is shown in FIG. 2 and FIG. 3, the optoelectronic component furthermore includes a conductor track structure formed from a first conductor track layer 10 and a second conductor track layer 11. The first conductor track layer 10 is arranged on the first electrically conductive electrode layer 3 embodied as an anode, for example on the top side 14 of the first electrode layer 3, said top side facing in the direction of the second electrically conductive electrode layer 7. The second conductor track layer 11 can be arranged on the second electrically conductive electrode layer 7 embodied as a cathode, in particular on the underside 15 of the second electrode layer 7, said underside facing in the direction of the first electrically conductive electrode layer 3. In this case, the two conductor track layers 10, 11 cannot completely cover the electrode layer 3, 7 on which they are arranged, rather the two conductor track layers 10, can be arranged in such a way that they form a closed area in the optoelectronic component. This means that, in a plan view of the conductor track structure, the latter extends over the entire area of the optoelectronic component, such that as far as possible no regions in which no conductor track structure is formed are provided over the area of the optoelectronic component. This is achieved by virtue of the fact that at the regions in which no first conductor track layer is formed at the electrode layer 3 embodied as an anode, the second conductor track layer 11 is formed at the electrode layer 7 embodied as a cathode, and vice versa. An overlap of the first conductor track layer 10 and the second conductor track layer 11 may be optional, for example not take place.

In the case of the configuration of the conductor track layers 10, 11 shown here, they are each formed from a multiplicity of wedge-shaped areas arranged parallel to one another. The wedge-shaped areas of the first conductor track layer 10 in this case extend from a first side 12 of the optoelectronic component to a second side 13 of the optoelectronic component, said second side being opposite said first side. By contrast, the wedge-shaped areas of the second conductor track layer 11 extend oppositely to the wedge-shaped areas of the first conductor track layer 10, by virtue of the wedge-shaped areas of the second conductor track layer 11 extending from the second side 13 of the organic light emitting unit toward the first side 12 of the optoelectronic component.

The conductor track structure or the conductor track layers 10, 11 of the conductor track structure are formed from an optically transparent material containing silver, for example as ductile silver or a magnesium-silver alloy, such that both the electrode layers 3, 7 and the conductor track structure, in conjunction with a good conductivity of the conductor track structure, are formed from an optically transparent material.

If, in the case of this configuration of the optoelectronic component, for example, a sheet resistance of 15 Ω is set in the two electrode layers 3, 7 and the resistance of the conductor track structure is 5 Ω, a uniformity of up to 78% is achieved, wherein the luminance is approximately 2683 nits at the edge region of the organic light emitting unit and approximately 1714 nits in the center of the optoelectronic component. If the sheet resistance in the two electrode layers is increased to 50 Ω and the resistance of the conductor track structure is kept at 5 Ω, an increase in the uniformity to 86% can be achieved, wherein the luminance is for example approximately 2458 nits at the edge region of the optoelectronic component and approximately 1861 nits in the center of the optoelectronic component, such that it is thereby possible to achieve a particularly good coordination between the electrode layers 3, 7 and the conductor track structure with regard to the highest possible uniformity.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An optoelectronic component, comprising:
a substrate,
a first electrically conductive electrode layer disposed on or over a top surface of
the substrate,
a second electrically conductive electrode layer over the first electrically
conductive electrode layer,
an organic layer structure between the first electrically conductive electrode layer
and the second electrically conductive electrode layer,
wherein the organic layer structure comprises, from a top view, a 2D-closed
shaped light-emitting region, the top view being a view facing the top surface of
the substrate, wherein the 2D-closed shaped light-emitting region has a first
portion and a second portion complementary to the first portion, and
a conductor track structure,
wherein the first electrically conductive electrode layer, the second electrically conductive electrode layer and the conductor track structure are formed in each case from an optically transparent material,
wherein the conductor track structure has a first conductor track layer and a second conductor track layer, wherein the first conductor track layer is arranged in a manner separated from the second conductor track layer,
wherein the first conductor track layer is arranged at the first electrically conductive electrode layer and the second conductor track layer is arranged at the second electrically conductive electrode layer,
wherein from the top view or a view opposite to the top view, the first conductive track layer covers all of the first portion and the second conductive track layer covers the second portion.

2. The optoelectronic component as claimed in claim 1, wherein the first electrically conductive electrode layer and the second electrically conductive electrode layer are formed from a same optically transparent material.

3. The optoelectronic component as claimed in claim 2, wherein an optically transparent material of the conductor track structure contains silver.

4. The optoelectronic component as claimed in claim 1, wherein an optically transparent material of the conductor track structure contains silver.

5. The optoelectronic component as claimed in claim 1, wherein the first conductor track layer and the second conductor track layer are spatially separated from one another by the organic layer structure.

6. The optoelectronic component as claimed in claim 1, wherein the first conductor track layer and the second conductor track layer are formed in each case from a multiplicity of areas arranged parallel to one another.

7. The optoelectronic component as claimed in claim 6, wherein each area of the multiplicities of areas is wedge-shaped.

8. The optoelectronic component as claimed in claim 1, wherein, from the top view, the first portion is uncovered by the second conductive track layer and, from the view opposite to the top view, the second portion is uncovered by the first conductive track layer.

9. The optoelectronic component as claimed in claim 1, wherein the first conductive track layer, from the top view, covers the first electrically conductive electrode layer and the second conductive track layer, from the view opposite to the top view, cover the second electrically conductive electrode layer.

* * * * *

UNITED STATES PATENT AND TRADEMARK OFFICE
CERTIFICATE OF CORRECTION

PATENT NO. : 9,627,643 B2  
APPLICATION NO. : 14/443401  
DATED : April 18, 2017  
INVENTOR(S) : Thomas Wehlus Page 1 of 1

It is certified that error appears in the above-identified patent and that said Letters Patent is hereby corrected as shown below:

In the Specification

Column 8, Line 56: Please insert the number --11-- between "10," and "can".

Column 8, Line 64: Please insert the number --10-- between the words "layer" and "is".

Signed and Sealed this  
Eleventh Day of July, 2017

Joseph Matal  
*Performing the Functions and Duties of the*  
*Under Secretary of Commerce for Intellectual Property and*  
*Director of the United States Patent and Trademark Office*